May 7, 1968 P. H. CONWAY 3,382,457

WIDE BAND VOLTAGE CONTROLLED MULTIVIBRATOR

Filed Jan. 3, 1967 2 Sheets-Sheet 1

CIRCUIT FOR OPERATION THEORY

BASE WAVEFORM

COLLECTOR WAVEFORM

INVENTOR
PATRICK H. CONWAY
BY Thomas J. Nikolai
ATTORNEY

May 7, 1968 P. H. CONWAY 3,382,457

WIDE BAND VOLTAGE CONTROLLED MULTIVIBRATOR

Filed Jan. 3, 1967 2 Sheets-Sheet 2

INVENTOR
PATRICK H. CONWAY

BY Thomas J. Nikolai
ATTORNEY

United States Patent Office 3,382,457
Patented May 7, 1968

3,382,457

WIDE BAND VOLTAGE CONTROLLED MULTIVIBRATOR

Patrick H. Conway, Minneapolis, Minn., assignor to Sperry Rand Corporation, New York, N.Y., a corporation of Delaware Filed Jan. 3, 1967, Ser. No. 606,947
5 Claims. (Cl. 331—113)

ABSTRACT OF THE DISCLOSURE

An astable multivibrator having the time constant network bias voltage and collector voltage swing varied by control voltages applied through a differential amplifier whereby it produces an arbitrary frequency versus control voltage characteristics including logarithmic frequency operation over a wide range including ranges greater than an octave or a decade.

*Background of the invention*

In the prior art, voltage controlled oscillators incorporate tuned circuits and reactance elements which do not allow a wide range of operation, i.e. frequency change versus input voltage. Further, no voltage controlled oscillator is known which will provide logarithmic frequency operation over ranges as great as one octave. In certain systems such as the phase lock loop disclosed in applicant's commonly assigned copending application entitled "Signal Conditioner and Bit Synchronizer," Ser. No. 660,159, filed July 27, 1967, a voltage controlled oscillator is required that provides a logarithmic frequency operation over a range of one octave. Thus, the percent change in frequency per increment change of input voltage will be constant over the entire frequency range of the oscillator.

*Summary*

The invention disclosed herein provides a voltage controlled oscillator in which the output frequency is controlled by varying the time constant network bias voltage and collector voltage swing of an astable multivibrator. A logarithmic output characteristic over a wide range of operation is produced by linearly and oppositely varying both voltages simultaneously. Further, if a source of individually selectable voltages each representing a predetermined frequency band is used to vary the collector voltage swing, the oscillator can be made to operate over a selected frequency band out of the entire frequency range. Also, by shaping the time constant network bias voltage and/or the collector voltage swing, the frequency or period response can be arbitrarily shaped.

Thus, it is an object of this invention to provide a voltage controlled oscillator in which the output frequency is controlled by independently varying the time constant network bias voltage and the collector voltage swing of an astable multivibrator.

It is also an object of this invention to provide an oscillator which can operate over selected portions of its entire operating range.

It is a further object of this invention to provide a voltage controlled oscillator that provides a logarithmic output over a wide range of operation when both the time constant network bias voltage and the collector voltage swing of the multivibrator are varied simultaneously.

It is yet another object of the present invention to provide a voltage controlled oscillator whose frequency or period response can be shaped as desired by varying the time constant network bias voltage and the collector voltage swing of the multivibrator.

*Brief description of the drawings*

These and other more detailed and specific objectives will be disclosed in the course of the following specification, reference being had to the accompanying drawings in which.

*Description of the preferred embodiment*

Figure 1:
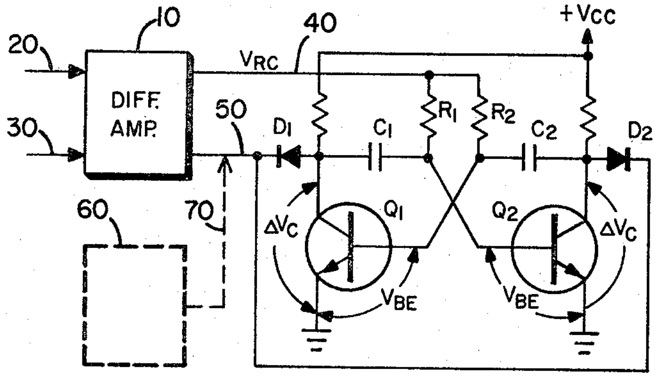
FIG. 1 discloses a circuit of a basic multivibrator for purposes of explaining the theory of operation of the present invention.

The theory of operation of the voltage controlled oscillator is based upon the circuit shown in FIG. 1. The period of oscillation of the circuit shown in FIG. 1 is given by the equation $$T=(R_1C_1+R_2C_2)\ \ln \frac{V_{RC}-V_{BE}+\Delta V_C}{V_{RC}-V_{BE}} \tag{1}$$

where ln is the natural logarithm (log to the base $\epsilon$), $V_{RC}$ is the time constant network bias voltage, $V_{BE}$ is the base voltage and $\Delta V_C$ is the collector voltage swing (collector voltage). (Note that the $V_{BE}$ term must also include the drops of diodes $D_5$ and $D_6$ in FIG. 3.) Differential amplifier 10 receives inputs on lines 20 and 30 and provides outputs on lines 40 and 50. The output on line 40 is used to control the time constant network bias voltage and the output on line 50 is used to control the collector voltage swing. When transistor $Q_1$ or $Q_2$ is conducting, the collector voltage is at or nearly at the saturation voltage of the transistor depending upon other circuit components as will be explained in relation to the detailed embodiment of the present invention shown in FIG. 3. When transistor $Q_1$ or $Q_2$ is non-conducting, the collector is clamped by diode $D_1$ or $D_2$ to the differential amplifier output voltage thus controlling the collector voltage swing, $\Delta V_C$. The collector waveform showing $\Delta V_C$ is shown in FIG. 2(*a*).

The oscillator may be made to operate over a selected frequency band out of the entire frequency range by providing a source 60 of individually selectable voltages each representing a predetermined frequency band. If line 50 is then disconnected from differential amplifier 10 and connected to source 60 as shown by dashed line 70, an individual frequency band can be selected.

Figure 2B:
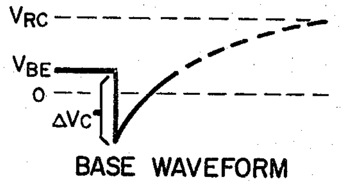
FIGS. 2(*a*) and (*b*) show the base and collector waveforms of the oscillator shown in FIG. 1.
Figure 2A:
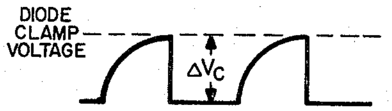

The waveform at the base of transistors $Q_1$ and $Q_2$ is shown in FIG. 2(*b*). When transistor $Q_1$ conducts, the collector swing is coupled to the base of transistor $Q_2$ via $C_1$ thus turning transistor $Q_2$ OFF. Capacitor $C_1$ then charges exponentially through $R_1$ to the voltage, $V_{RC}$, at the junction of $R_1$ and $R_2$. When the base voltage of $Q_2$ reaches a point, $V_{BE}$, causing transistor $Q_2$ to conduct, the collector swing of $Q_2$ is coupled to the base of transistor $Q_1$ via capacitor $C_2$ thus turning transistor $Q_1$ OFF and the cycle is repeated.

Figure 3:
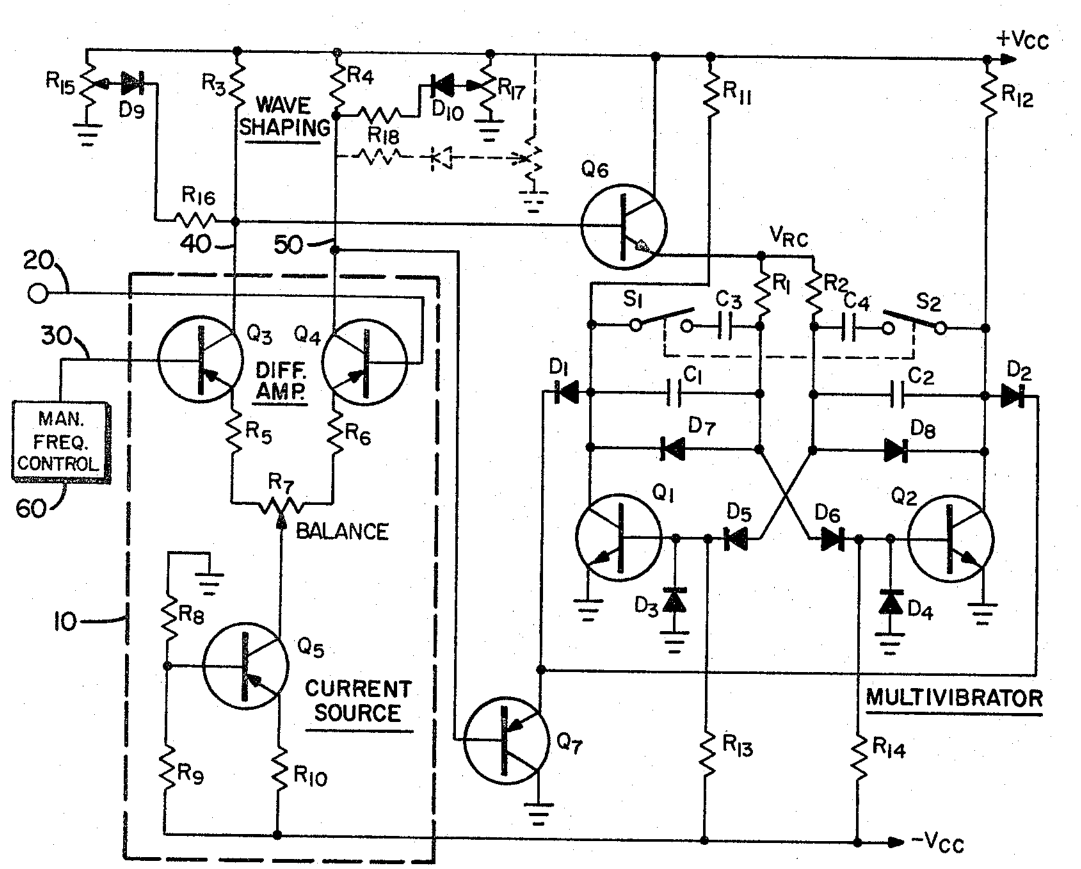
FIG. 3 discloses the circuit of the preferred embodiment of the present invention.

The detailed embodiment of the present invention is shown in FIG. 3 wherein components disclosed in FIG. 1 are like numbered. Transistors $Q_3$ and $Q_4$ and associated components comprise differential amplifier 10. When the base of transistor $Q_3$ goes positive with respect to the base of transistor $Q_4$, the collector of transistor $Q_3$ goes negative and the collector of transistor $Q_4$ goes positive. If the base of transistor $Q_3$ goes negative with respect to the base of transistor $Q_4$, the collector of transistor $Q_3$ goes positive and the collector of transistor $Q_4$ goes negative. When the voltages at the bases of transistors $Q_3$ and $Q_4$ are equal (within the operating range of the amplifier) the collector voltages of $Q_3$ and $Q_4$ are at some given quiescent value.

Transistor $Q_5$ and associated components comprise a current source. The collector current of transistor $Q_5$ is nearly independent of the collector-emitter voltage drop of transistor $Q_5$. Thus, the sum of the emitter currents of transistors $Q_3$ and $Q_4$ is constant. Potentiometer $R_7$ is a balance adjustment for the differential amplifier 10 and is adjusted to obtain the desired current division between transistors $Q_3$ and $Q_4$.

Diodes $D_9$ and $D_{10}$ and associated components at the collectors of transistors $Q_3$ and $Q_4$ comprise wave-shaping circuits. With the diodes reverse-biased, the circuits have no effect. When the collector voltage of transistor $Q_3$ is negative with respect to the wiper arm of potentiometer $R_{15}$ (or the collector voltage of transistor $Q_4$ is negative with respect to potentiometer $R_{17}$), the diode $D_9$ (or $D_{10}$) is forward biased which places $R_{16}$ (or $R_{18}$) in parallel with the collector resistor $R_3$ (or $R_4$). Thus, the gain of the differential amplifier 10 is changed. Diodes $D_9$ and $D_{10}$ can be reversed in polarity, more than one diode can be used to connect resistance in parallel with the collector resistance or other non-linear devices can be used for the generation of arbitrary waveshapes at the output of the differential amplifier circuit.

As explained in relation to the circuit shown in FIG. 1, the multivibrator of FIG. 3 includes transistors $Q_1$ and $Q_2$ and associated circuits. Time constant networks $R_1C_1$ and $R_2C_2$ determine the frequency of the oscillations for given values of the control voltages. Bandswitching may be achieved by switching components of various values in the RC timing network. For example, capacitors $C_3$ and $C_4$ may be switched in parallel with capacitors $C_1$ and $C_2$ by closing the contacts of switch $S_1$. The switch may be mechanical, electromechanical such as relay contacts, or electronic. This type of bandswitching is used to obtain the 1000:1 band multiplication in the system disclosed in applicants' above mentioned copending application entitled "Signal Conditioner and Bit Synchronizer." Diodes $D_1$ and $D_2$ are used to clamp the upper level of the collector waveforms shown in FIG. 2(*a*) to a value determined by the voltage from the differential amplifier 10 on lines 40 and 50. Diodes $D_7$ and $D_8$ prevent saturation of the transistors and could be removed for purposes of this invention. Other components in the multivibrator are used for normal biasing and circuitry considerations and are not considered pertinent to the inventive concept. Consequently their functions will not be considered in the application.

Transistors $Q_6$ and $Q_7$ are emitter-followers used as buffers between the differential amplifier 10 and the multivibrator.

Figure 4:
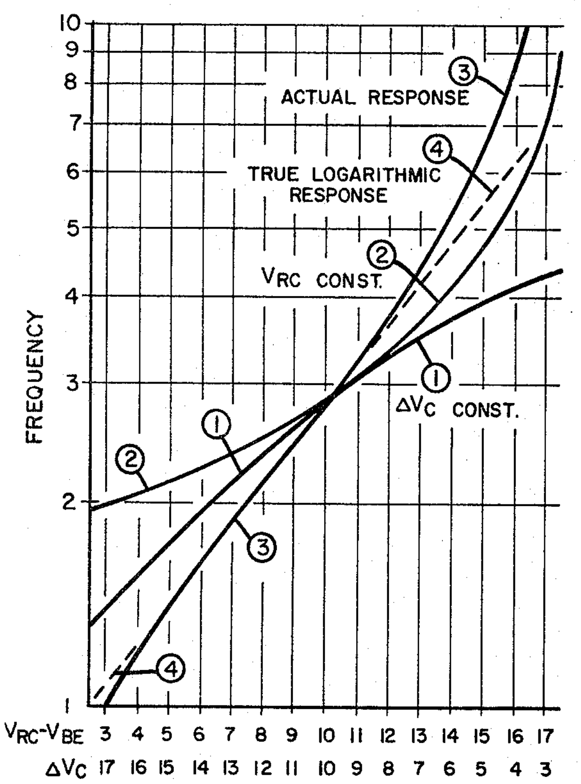
FIG. 4 is a graph of response curves applicable to the preferred embodiment of the present invention.
Figure 5A:
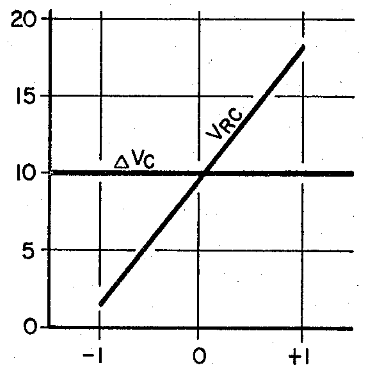
FIGS. 5(*a*), (*b*), (*c*) and (*d*) are graphs showing how the base and collector input voltages may be varied.
Figure 5B:
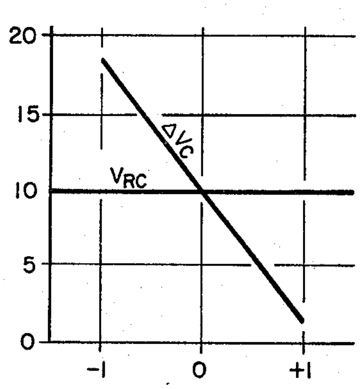
Figure 5C:
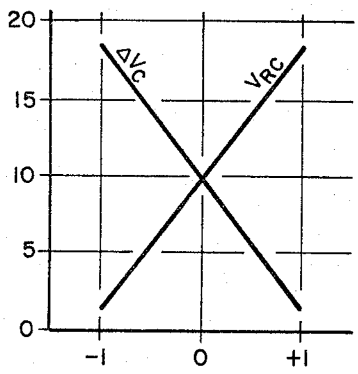
Figure 5D:
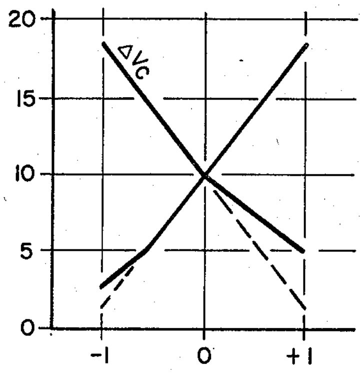

Since the frequency of oscillation is the inverse of the period, T, Equation 1 may be used to determine the frequency of the voltage controlled oscillator. Curve 1 in FIG. 4 is a plot of the frequency of the device with the collector swing, $\Delta V_C$ held constant and the time constant network bias voltage, $V_{RC}$, varying. Curve 2 is a plot of the frequency of the device with $V_{RC}$ held constant and $\Delta V_C$ varying. Curve 3 is a plot of the frequency of the device with both $\Delta V_C$, and $V_{RC}$ changing linearily in opposite directions. Note that a nearly perfect logarithmic response is obtained over a one octave range, from 1.4 to 2.8 on the log scale. It should be pointed out that only the normalized frequency is indicated, the actual value depending upon the values of the time constant networks. Curve 4 in FIG. 4 is a plot of true logarithmic response in order that the actual response shown in curve 3 can be compared thereto.

As stated earlier, various frequency responses versus input voltage may be obtained depending on the waveshaping at the differential amplifier output. Graph (*a*) in FIG. 5 is plotted on linear grid paper and indicates a linear $V_{RC}$ output and a constant $\Delta V_C$ output from differential amplifier 10. A "constant output" may be obtained by disconnecting the lead from the differential amplifier and applying a fixed voltage to the multivibrator input. With this input to the multivibrator, response curve 1 in FIG. 4 is obtained. Note that the output voltage from the differential amplifier is a function of the difference in the voltages applied to the bases of transistors $Q_3$ and $Q_4$. Graph (*b*) in FIG. 5 indicates a linear output of the $\Delta V_C$ voltage from the differential amplifier and a constant output from the $V_{RC}$ terminal. The resultant frequency response of the multivibrator to this input voltage is shown by response curve 2 in FIG. 4. Graph (*c*) in FIG. 5 shows the outputs from the differential amplifier when both $\Delta V_C$ and $V_{RC}$ are varying linearly. This is the manner in which the present voltage controlled oscillator is used in the above mentioned copending application entitled "Signal Conditioner and Bit Synchronizer." These input voltages to the multivibrator cause a frequency output as plotted by response curve 3 in FIG. 4 as stated previously and it will be seen how closely it parallels response curve 4 which indicates a true logarithmic response.

Since the output voltage from the differential amplifier is a function of the difference in the voltages applied to the bases of transistors $Q_3$ and $Q_4$, it will be evident, referring to FIG. 3, that a manual frequency control 60 can be connected via input line 30 to the base of transistor $Q_3$ whereupon when the frequency control 60 is adjusted to provide one of a plurality of output voltages, differential amplifier 10 will produce one of a like plurality of output voltages accordingly. These different output voltages from differential amplifier will, as explained previously, cause the multivibrator to provide different frequency outputs.

Various frequency responses (differential amplifier input versus frequency output) can be obtained by shaping the differential amplifier output characteristics. For example, the logarithmic range of curve 3 in FIG. 4 can be extended by reducing the effect of $\Delta V_C$, shown in graph (*b*) in FIG. 5, at the high frequency end as shown by graph (*d*) by reducing the gain of the $\Delta V_C$ output above mid-range and by reducing the effect of $V_{RC}$, shown in graph (*a*), at the low frequency end as shown in graph (*d*) by reducing the gain of the $V_{RC}$ output below mid-range. The resultant differential amplifier output characteristic is illustrated in graph (*d*) and can be attained by adjusting resistors $R_{15}$ and $R_{16}$ for the proper break points.

Thus, a novel voltage controlled oscillator has been disclosed which provides inherent logarithmic frequency operation over a range greater than one octave, and that provides a frequency or period response characteristic that can be arbitrarily shaped.

I claim:

1. A wide band voltage controlled oscillator comprising:
   (a) a differential amplifier for receiving first and second inputs and producing first and second variable voltage outputs, and
   (b) an astable multivibrator for producing a range of output frequencies greater than one octave, said multivibrator being coupled to said differential amplifier and comprising:
      (1) a first and a second stage,
      (2) a pair of coupling networks for coupling said stages together whereby said first and second stages alternately conduct while the opposite one of said stages is substantially cutoff, said coupling networks having a common terminal coupled to said differential amplifier for receiving said first variable voltage, and
      (3) a control element for each stage coupled to said differential amplifier for receiving said second variable voltage whereby said multivibrator is enabled to produce said frequency range.

2. An oscillator as in claim 1 wherein said first and second differential amplifier inputs respectively comprise:

(a) a first predetermined voltage coupled to said first input terminal representing a desired frequency range, and (b) a second control voltage coupled to said second input terminal for controlling the frequency of said multivibrator within said range.

3. An oscillator as in claim 2 further including:

(a) first and second wave shaping circuits connected to said differential amplifier for receiving said first and second variable voltages and shaping them for the coupling networks and the control element respectively so as to obtain various frequency responses from said multivibrator output.

4. An oscillator as in claim 3 wherein each of said wave shaping circuits comprises:

(a) a potentiometer having a wiper arm and first and second ends connected to first and second potential sources respectively, (b) a resistor having one end coupled to said first potential source and the other end coupled to said differential amplifier for receiving one of said variable voltage outputs, and (c) a series connected diode and resistor combination connected between said wiper arm and said other end of said resistor whereby varying said wiper arm changes the variable voltage received by said resistor thereby changing the frequency response of said multivibrator.

5. A wide band voltage controlled oscillator comprising:

(a) a differential amplifier for receiving first and second inputs and producing a variable voltage output, (b) control voltage means for producing individually selectable voltages each representing a predetermined frequency band, and (c) an astable multivibrator for producing a range of output frequencies greater than one octave, said multivibrator being coupled to said differential amplifier and said control voltage means and comprising:

(1) a first and a second stage each having an input and a control terminal, (2) a pair of coupling networks each being coupled to a respective stage input and coupling said stages together whereby said first and second stages alternately conduct while the opposite one of said stages is substantially cutoff, said coupling networks having a common terminal coupled to said differential amplifier for receiving said variable voltage, and (3) a control element for each stage coupled to the control terminal of said stage and to said control voltage means for receiving said individually selectable voltages whereby said multivibrator is enabled to produce a selected band of said frequency range.

References Cited

UNITED STATES PATENTS 3,178,658 4/1965 Henrion ---------- 331—177 X

OTHER REFERENCES

Electronic Design, May 24, 1965, p. 52.

ROY LAKE, *Primary Examiner.*

S. H. GRIMM, *Assistant Examiner.*